(12) United States Patent
Sakaguchi et al.

(10) Patent No.: US 7,866,534 B2
(45) Date of Patent: Jan. 11, 2011

(54) CONDUCTOR BALL MOUNTING APPARATUS, CONDUCTOR BALL MOUNTING METHOD, MASK USED FOR MOUNTING CONDUCTOR BALL, AND MASK MANUFACTURING METHOD

(75) Inventors: Hideaki Sakaguchi, Nagano (JP); Kiyoaki Iida, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 8 days.

(21) Appl. No.: 12/166,673

(22) Filed: Jul. 2, 2008

(65) Prior Publication Data

US 2009/0008433 A1 Jan. 8, 2009

(30) Foreign Application Priority Data

Jul. 4, 2007 (JP) ............................. 2007-176328

(51) Int. Cl.
*B23K 31/02* (2006.01)
(52) U.S. Cl. ................................ 228/180.22
(58) Field of Classification Search ................ 228/178, 228/179.1, 180.1, 180.21, 180.22, 4.1, 6.2
See application file for complete search history.

(56) References Cited

U.S. PATENT DOCUMENTS

2002/0058406 A1* 5/2002 Mukuno et al. ............. 438/626

FOREIGN PATENT DOCUMENTS

| JP | 02238693 A | * | 9/1990 |
| JP | 2000-332044 | | 11/2000 |
| JP | 2004-165492 | | 6/2004 |
| JP | 2006-073999 | | 3/2006 |

OTHER PUBLICATIONS

English Machine Translation of JP 2004-165492 Murayama et al.*

* cited by examiner

*Primary Examiner*—Emily M Le
*Assistant Examiner*—Megha Mehta
(74) *Attorney, Agent, or Firm*—Rankin, Hill & Clark LLP

(57) ABSTRACT

There is provided a conductive ball mounting apparatus. The conductive ball mounting apparatus includes: a conductive ball mounting mask disposed to oppose a substrate having a plurality of pads coated with an adhesive flux, the conductive ball mounting mask having a plurality of ball mounting through holes for mounting each of conductive balls on each of the plurality of pads, the plurality of ball mounting through holes being arranged to oppose to the plurality of pads; and a conductive ball supplying unit for moving or removing the conductive balls on the conductive ball mounting mask by sucking an air on an upper surface side of the conductive ball mounting mask. The conductive ball mounting mask includes through portions formed to block passing of the conductive balls.

2 Claims, 16 Drawing Sheets

CONDUCTOR BALL MOUNTING APPARATUS, CONDUCTOR BALL MOUNTING METHOD, MASK USED FOR MOUNTING CONDUCTOR BALL, AND MASK MANUFACTURING METHOD

This application is based on and claims priority from Japanese Patent Application No. 2007-176328, filed on Jul. 4, 2007, the entire contents of which are hereby incorporated by reference.

BACKGROUND OF THE INVENTION

1. Technical Field

The present invention relates to a conductive ball mounting apparatus, a conductive ball mounting method, a mask used for mounting conductive balls, and a mask manufacturing method. More particularly, the present invention relates to a conductive ball mounting apparatus for mounting one conductive ball on each of a plurality of pads coated with an adhesive flux formed on a substrate such as a wiring substrate or a semiconductor wafer, a conductive ball mounting method, a mask used for mounting conductive balls, and a mask manufacturing method.

2. Background Art

FIG. 1 is a sectional view of a conductive ball mounting apparatus in the related art. FIG. 1 shows a conductive ball mounting apparatus 10 mounting each of conductive balls 24 on each of a plurality of pads 17 formed on a substrate 15.

By reference to FIG. 1, the conductive ball mounting apparatus 10 in the related art includes a stage 11, a conductive ball mounting mask 12, and a conductive ball supplying unit 13.

The stage 11 is configured to hold the substrate 15 having the plurality of pads 17 coated with a flux 16. The conductive ball mounting mask 12 is disposed over the substrate 15 such that the conductive ball mounting mask 12 is stretched by a certain tension in the horizontal direction (a state that the conductive ball mounting mask 12 is not caused to bend). The conductive ball mounting mask 12 has a plurality of ball mounting through holes 19 that are used to mount each of the conductive balls 24 on each of the plurality of pads 17 (pads on which the flux 16 is coated).

The conductive ball supplying unit 13 has a suction head 21, a sucking unit 22, and a driving unit 23. The suction head 21 has an inlet port 21A. The suction head 21 is disposed over the conductive ball mounting mask 12 such that the inlet port 21A opposes to the conductive ball mounting mask 12. When the sucking unit 22 is driven, the suction head 21 collects the plurality of conductive balls 24, which are supplied onto the conductive ball mounting mask 12, on a portion of the conductive ball mounting mask 12 opposing to the suction head 21.

The sucking unit 22 is provided on the suction head 21. The sucking unit 22 sucks the portion of the conductive ball mounting mask 12 opposing to the inlet port 21A (upper surface 12A side of the conductive ball mounting mask 12) via the inlet port 21A.

The driving unit 23 is provided to the suction head 21. The driving unit 23 moves the suction head 21 in the direction that is parallel with the upper surface 12A of the conductive ball mounting mask 12.

The conductive ball supplying unit 13 mounts each of the conductive balls 24 on each of the plurality of pads 17 (pads on which the flux 16 is coated) by moving the suction head 21 and the plurality of conductive balls 24 in the direction that is parallel with the upper surface 12A of the conductive ball mounting mask 12, while collecting the plurality of conductive balls 24, which are supplied onto the upper surface 12A of the conductive ball mounting mask 12, on the portion of the upper surface 12A of the conductive ball mounting mask 12 opposing to the inlet port 21A of the suction head 21 (see e.g., JP-A-2006-73999).

However, when each of the conductive balls 24 is mounted on each of the plurality of pads 17 using the conductive ball mounting mask 12 in the related art, an air flow between the upper side and the lower side of the conductive ball mounting mask 12 is worsened in respective areas where the conductive balls 24 are mounted on the pads 17, as shown in FIG. 1.

FIG. 2 is a view to describe disadvantages when each of the conductive balls is mounted on each of the pads using the conductive ball mounting apparatus in the related art. In FIG. 2, the same reference symbols are affixed to the same constituent portions as those of the structure shown in FIG. 1.

As shown in FIG. 2, in the related art method, the conductive ball mounting mask 12 is lifted up from a certain position by a sucking force generated by the conductive ball supplying unit 13. In this manner, when the conductive ball mounting mask 12 is lifted up from the certain position, other balls 24 fall through the ball mounting through holes 19 positioned over the pads 17 on which each of the conductive balls 24 is mounted. As a result, such a problem existed that the mounting position of the conductive balls 24 mounted on the pads 17 is displaced from a desired position, or such a problem existed that the plurality of conductive balls 24 are mounted on each of the pads 17.

SUMMARY OF THE INVENTION

It is an object of the present invention to provide a conductive ball mounting apparatus capable of mounting one conductive ball on each of a plurality of pads coated with an adhesive flux without fail, a conductive ball mounting method, a mask used for mounting conductive ball, and mask manufacturing method.

According to one or more aspects of the present invention, there is provided a conductive ball mounting apparatus. The conductive ball mounting apparatus includes: a conductive ball mounting mask disposed to oppose a substrate having a plurality of pads coated with an adhesive flux, the conductive ball mounting mask having a plurality of ball mounting through holes for mounting each of conductive balls on each of the plurality of pads, the plurality of ball mounting through holes being arranged to oppose to the plurality of pads; and a conductive ball supplying unit for moving or removing the conductive balls on the conductive ball mounting mask by sucking an air on an upper surface side of the conductive ball mounting mask. The conductive ball mounting mask includes through portions formed to block passing of the conductive balls.

According to the present invention, the portion of the conductive ball mounting mask being disposed over the pads on which the conductive ball is mounted respectively is never lifted up from a certain position. As a result, one conductive ball can be mounted on each of the plurality of pads without fail.

Also, the through portions may be configured to perform a ventilation of an air between an upper space and a lower space of the conductive ball mounting mask by a suction generated by the conductive ball supplying unit.

According to the present invention, a pressure difference between the upper space and the lower space of the conductive ball mounting mask can be reduced. As a result, such a situation can be prevented that the conductive ball mounting mask is lifted up from a certain position.

Also, the through portions are disposed near the plurality of ball mounting through holes.

According to the present invention, such a situation can be prevented that the portions of the conductive ball mounting mask being disposed over the pads on which one conductive ball is mounted is lifted up from a certain position.

Also, the conductive ball mounting mask is formed like a thin plate, and has a plate body in which the plurality of ball mounting through holes and the through portions are formed, and supporting portions for supporting the plate body and contacting the substrate.

According to the present invention, a relative displacement of the ball mounting through holes corresponding to the plurality of pads can be reduced. As a result, the conductive ball can be mounted in given positions on the plurality of pads with good precision respectively.

Also, the conductive ball mounting mask may be made of silicon.

According to the present invention, since the silicon is used as the material of the conductive ball mounting mask, a deformation of the thinned silicon plate produced by an external force is smaller than the metallic foil. Therefore, when the conductive ball mounting mask is stretched in the horizontal direction by a certain tension to restrict its position, a relative displacement of the ball mounting through holes from the plurality of pads can be reduced. As a result, the conductive ball is mounted in given positions on the plurality of pads with good precision respectively.

According to one or more aspects of the present invention, in a conductive ball mounting method of mounting one conductive ball on each of a plurality of pads coated with and adhesive flux on a substrate, the conductive ball mounting method includes:

(a) disposing a conductive ball mounting mask over the substrate such that the conductive ball mounting mask opposes to the substrate, wherein the conductive ball mounting mask includes a plurality of ball mounting through holes for mounting each of conductive balls on each of the plurality of pads and through portions formed to block passing of the conductive balls;

(b) supplying the plurality of conductive balls on the conductive ball mounting mask; and (c) moving or removing the plurality of conductive balls on the conductive ball mounting mask by sucking an air on an upper surface side of the conductive ball mounting mask.

Also, the through portions may be disposed near the plurality of ball mounting through holes.

According to one or more aspects of the present invention, in a conductive ball mounting mask disposed to oppose a substrate having a plurality of pads coated with an adhesive flux, the conductive ball mounting mask includes:

a plurality of ball mounting through holes for mounting each of conductive balls on each of the plurality of pads, the plurality of ball mounting through holes being arranged to oppose to the plurality of pads; and through portions configured to perform a ventilation of an air between an upper space and a lower space of the conductive ball mounting mask and formed to block passing of the conductive balls.

Also, the through portions may be disposed near the plurality of ball mounting through holes.

According to one or more aspects of the present invention, in a method of manufacturing a conductive ball mounting mask, the method includes:

(a) preparing a silicon substrate formed like a thin plate;

(b) forming a resist film on the silicon substrate;

(c) patterning the resist film such that portions of the silicon substrate corresponding to areas in which ball mounting through holes are to be formed are exposed and portions of the silicon substrate corresponding to areas in which through portions are to be formed are exposed;

(e) forming simultaneously the mounting through holes and the through portions by an anisotropic etching using the resist film as a mask; and (f) removing the resist film, wherein the through portions are formed to block passing of conductive balls.

According to the present invention, the conductive ball mounting mask made of silicon substrate can be manufactured.

DETAILED DESCRIPTION OF THE EXEMPLARY EMBODIMENT

Exemplary embodiments of the present invention will be described with reference to the drawings hereinafter.

Figure 1:
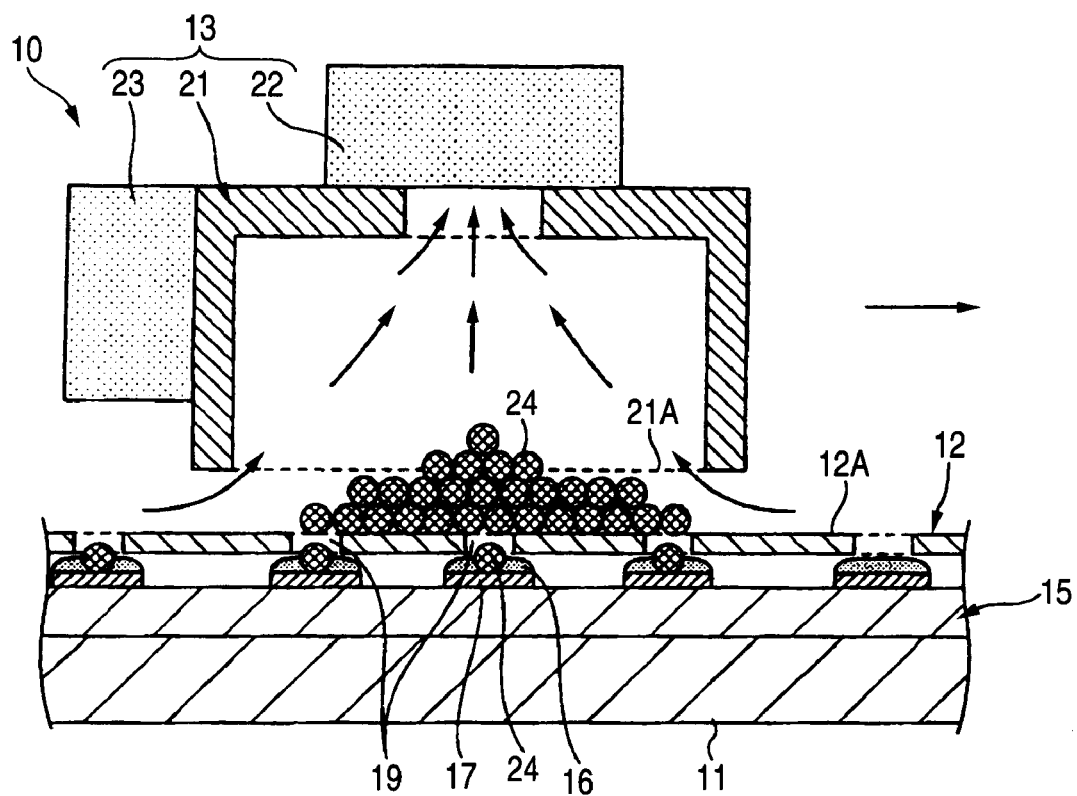
FIG. 1 is a cross-sectional view of a conductive ball mounting apparatus in the related art.
Figure 2:
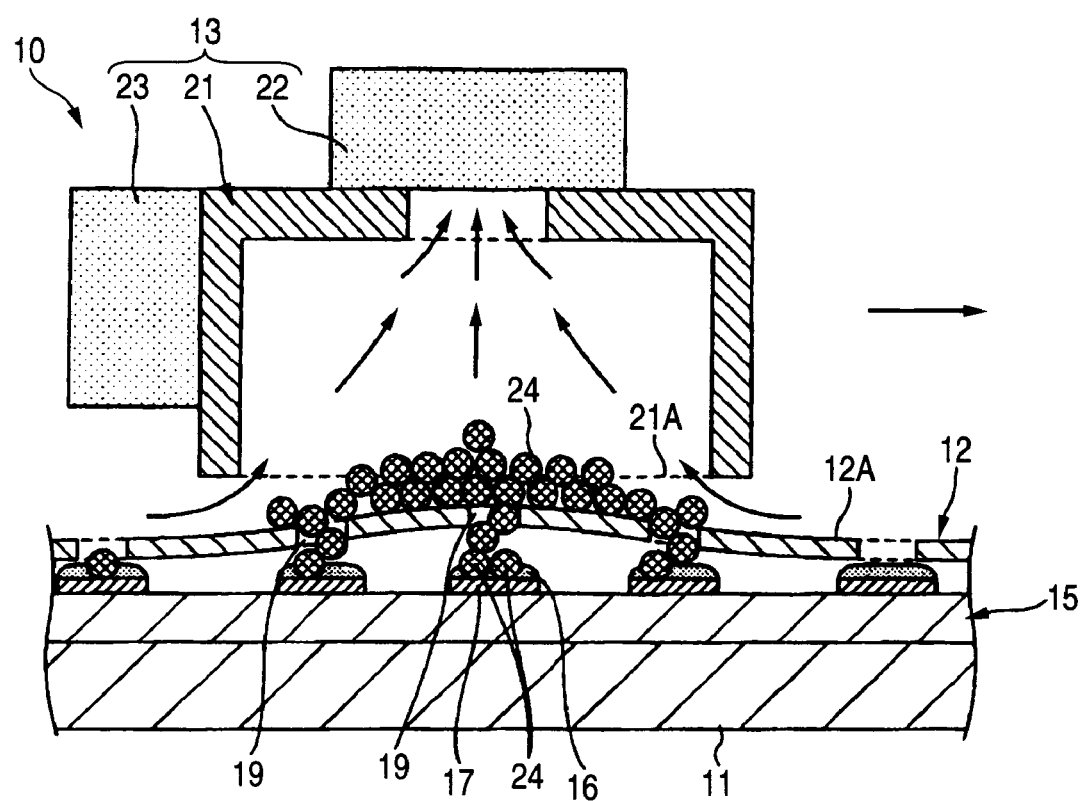
FIG. 2 is a view to describe disadvantages when a conductive ball is mounted on each of a plurality of pads using the conductive ball mounting apparatus in the related art.
Figure 3:
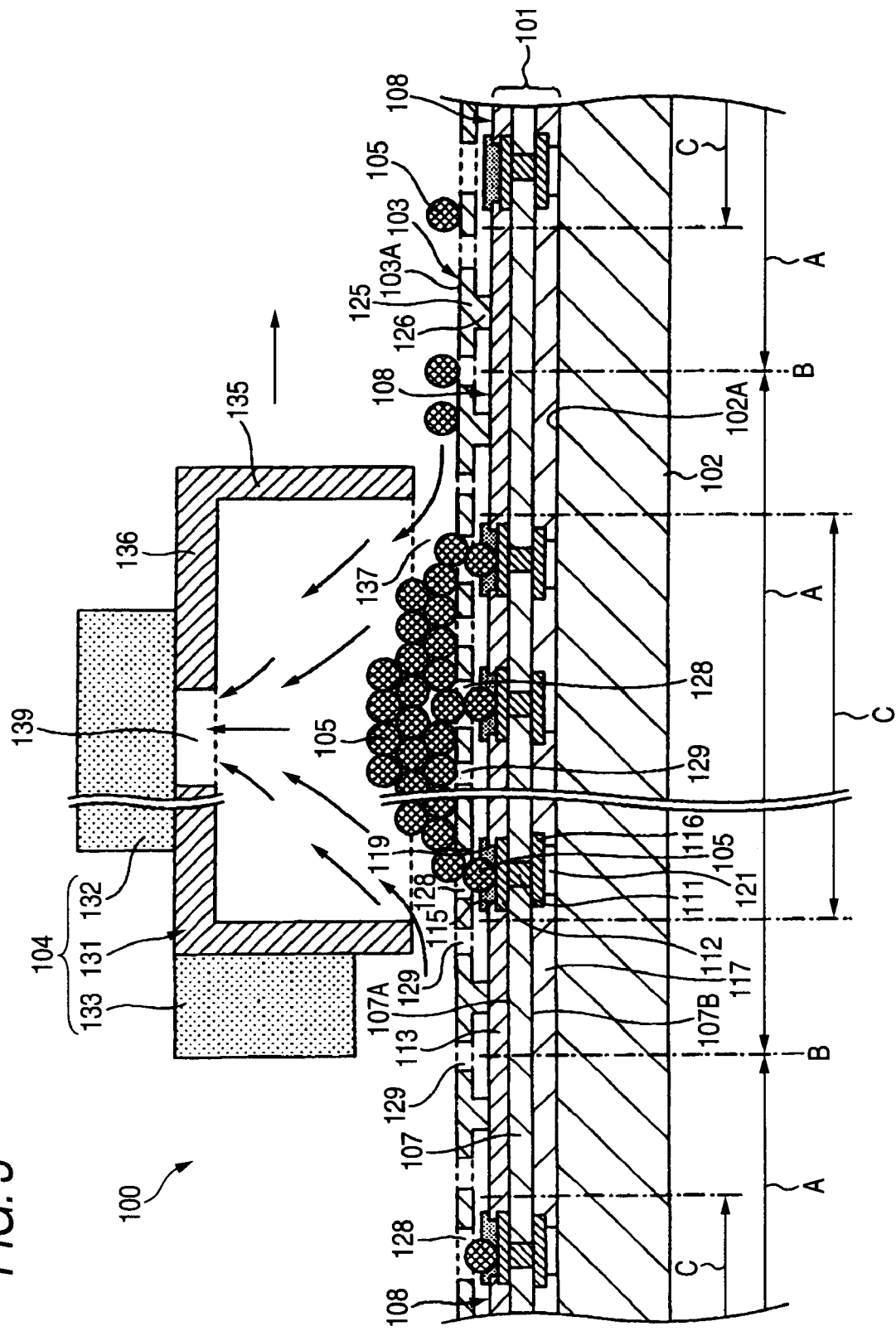
FIG. 3 is a sectional view of a conductive ball mounting apparatus according to an embodiment of the present invention.

FIG. 3 is a sectional view of a conductive ball mounting apparatus according to an embodiment of the present invention. FIG. 3 shows a state that conductive balls 105 are mounted on a plurality of pads 112 formed on a substrate 101 using a conductive ball mounting apparatus 100 of the present embodiment.

By reference to FIG. 3, the conductive ball mounting apparatus 100 of the present embodiment includes a stage 102 for holding the substrate 101 thereon, a conductive ball mounting mask 103, and a conductive ball supplying unit 104.

Figure 4:
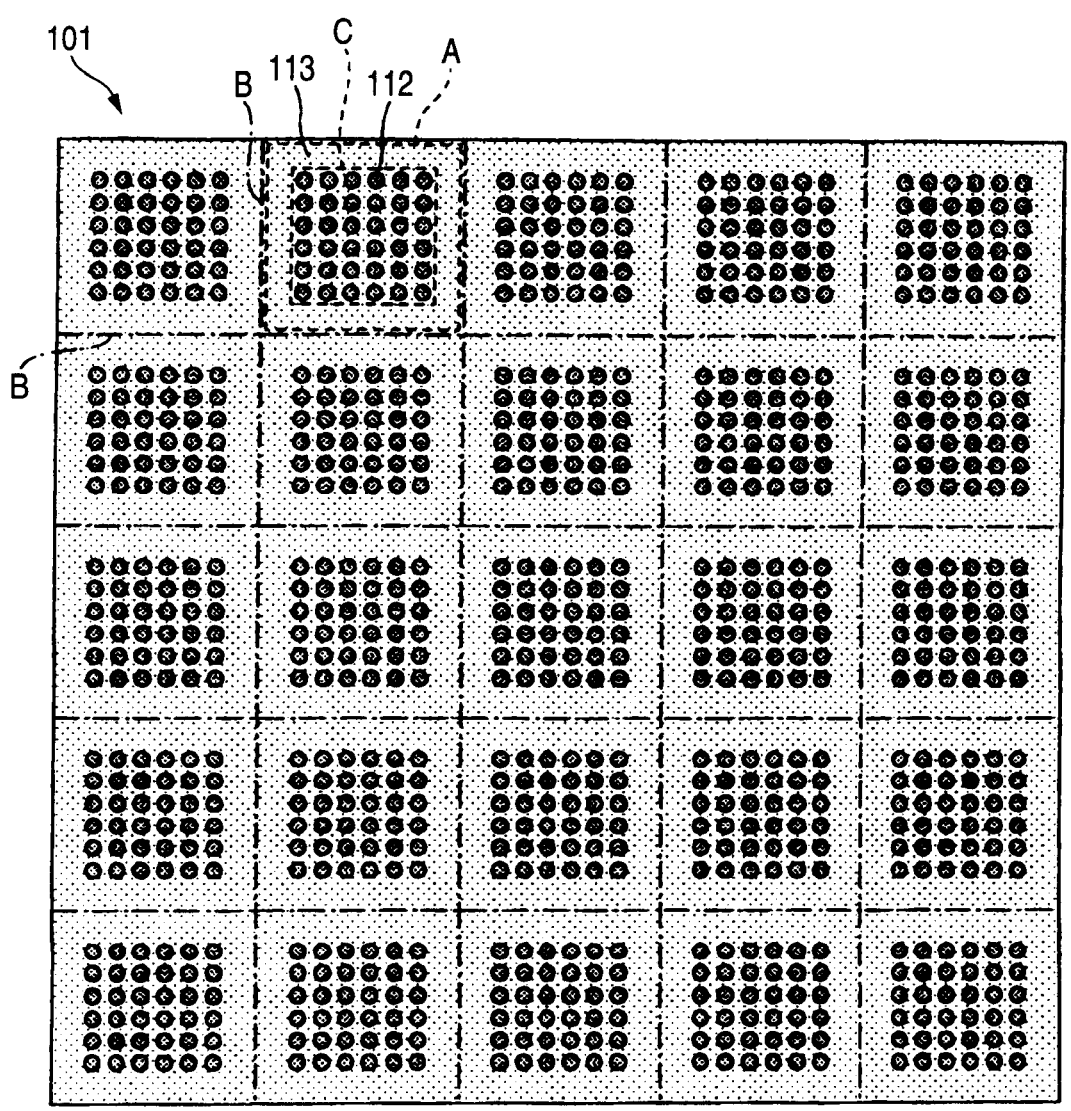
FIG. 4 is a plan view of a substrate shown in FIG. 3.

FIG. 4 is a plan view of the substrate 101 shown in FIG. 3. For convenience of explanation, illustration of an adhesive flux 115 shown in FIG. 3 is omitted from FIG. 4.

At first, for convenience of explanation, a configuration of the substrate 101 held on the stage 102 will be described with reference to FIG. 3 and FIG. 4 hereunder. The substrate 101 is configured to be divided into many pieces and a substrate 108 is formed in each of substrate forming areas A of a substrate main body 107. In other words, a plurality of substrates 108 are formed integrally in the substrate 101. The plurality of substrates 108 are divided into individual pieces by cutting the substrate 101 along cutting positions B. As the substrate 108, for example, a wiring substrate (concretely, e.g., interposer), a semiconductor chip such as IC, LSI, or the like can be taken as an example. In the present embodiment, following explanation will be made by taking as an example the case where the wiring substrate is used as the substrate 108.

The substrate 108 includes the substrate main body 107, through electrodes 111, pads 112, 116, solder resists 113, 117, and the adhesive fluxes 115. The substrate main body 107 is used to form the through electrodes 111, the pads 112, 116, and the solder resists 113, 117. As the material of the substrate main body 107, for example, a glass epoxy resin can be employed.

The through electrode 111 is provided to pass through the portion of the substrate main body 107 positioned between the pad 112 and the pad 116. One end portion of the through electrode 111 is connected to the pad 112, and the other end portion is connected to the pad 116. The through electrode 111 is provided to connect electrically the pad 112 and the pad 116. As the material of the through electrode 111, for example, Cu can be employed.

The pad 112 is provided in plural on a surface 107A of the substrate main body 107 (surface of the substrate main body 107 on the side on which the conductive balls 105 are mounted) in a pad forming area C. The pad 112 provides a pad on which the conductive ball 105 serving as an external connection terminal of the substrate 108 is mounted. As the pad 112, for example, a Cu/Ni/Au laminated film formed by forming sequentially a Cu film, a Ni film, and an Au film on the surface 107A of the substrate main body 107, a Cu/Pd/Ni/Au laminated film formed by forming sequentially a Cu film, a Pd film, a Ni film, and an Au film on the surface 107A of the substrate main body 107 can be employed.

The solder resist 113 has openings 119 from which areas in which the conductive ball 105 is disposed on the pad 112 are exposed. The solder resist 113 is provided on the surface 107A of the substrate main body 107 to cover the outer peripheral portions of the pads 112.

The adhesive flux 115 is coated on each of the plurality of pads 112 exposed from the openings 119. The adhesive flux 115 is coated to secure temporarily the conductive ball 105 to the pad 112. As the adhesive flux 115, for example, the flux, the solder paste, or the like can be used.

The pads 116 are provided on a surface 107B of the substrate main body 107 (surface of the substrate main body 107 on the opposite side to the surface 107A of the substrate main body 107). The pads 116 provides a pad on which an electronic component (for example, passive component, active component or semiconductor chip such as IC or LSI) is mounted. As the pad 116, for example, a Cu/Ni/Au laminated film formed by forming sequentially a Cu film, a Ni film, and an Au film on the surface 107B of the substrate main body 107, a Cu/Pd/Ni/Au laminated film formed by forming sequentially a Cu film, a Pd film, a Ni film, and an Au film on the surface 107B of the substrate main body 107 can be employed.

The solder resist 117 has openings 121 from which areas on which the electronic component (not shown) is mounted are exposed. The solder resist 117 is provided on the surface 107B of the substrate main body 107 to cover a part of the pads 116.

The substrates 108 constructed as above are held on the stage 102 such that the plurality of pads 112 coated with the adhesive flux 115 are opposed to the conductive ball mounting mask 103.

By reference to FIG. 3, the stage 102 is used to hold the substrate 101, and is disposed under the conductive ball supplying unit 104.

The conductive ball supplying unit 104 has a suction head 131, a sucking unit 132, and a driving unit 133. The suction head 131 has a cylinder portion 135, and a plate portion 136 provided to the upper end of the cylinder portion 135. The cylinder portion 135 has an inlet port 137 at the end portion on the opposite side to the side on which the plate portion 136 is provided. A clearance between a lower end of the cylinder portion 135 and an upper surface 103A of the conductive ball mounting mask 103 should be formed larger than a diameter of the conductive ball 105. In this manner, the clearance between the lower end of the cylinder portion 135 and the upper surface 103A of the conductive ball mounting mask 103 is formed larger than the diameter of the conductive ball 105. Therefore, such a situation can be prevented that the conductive ball 105 is pinched between the suction head 131 and the conductive ball mounting mask 103 and thus such conductive ball 105 is deformed. The plate portion 136 has an opening 139 connected to the sucking unit 132. This opening 139 provides an opening that allows an air kept under the suction head 131 to pass through the sucking unit 132.

The sucking unit 132 is provided on the plate portion 136. The sucking unit 132 sucks an air located in vicinity of the upper surface 103A, which opposes to the inlet port 137, of the conductive ball mounting mask 103 via the opening 139. Therefore, the sucking unit 132 collects a plurality of conductive balls 105 in a certain area (concretely, an area of the conductive ball mounting mask 103 opposing to the inlet port 137) of the conductive ball mounting mask 103 (in a state shown in FIG. 3).

The driving unit 133 is provided to the suction head 131. The driving unit 133 mounts the conductive ball 105 on each of a plurality of pads 112 by moving the suction head 131 in the direction parallel with the upper surface 103A of the conductive ball mounting mask 103 while the sucking unit 132 is sucking an air located in vicinity of the upper surface 103A of the conductive ball mounting mask 103.

The conductive ball supplying unit 104 constructed as above moves or removes a plurality of conductive balls 105 on the conductive ball mounting mask 103 by sucking the upper surface side of the conductive ball mounting mask 103, whereby the conductive ball 105 is mounted on each of the plurality of pads 112.

The conductive ball mounting mask 103 is disposed on the substrate 101, and has a plate body 125 shaped like a thin plate, and supporting portions 126.

Figure 5:
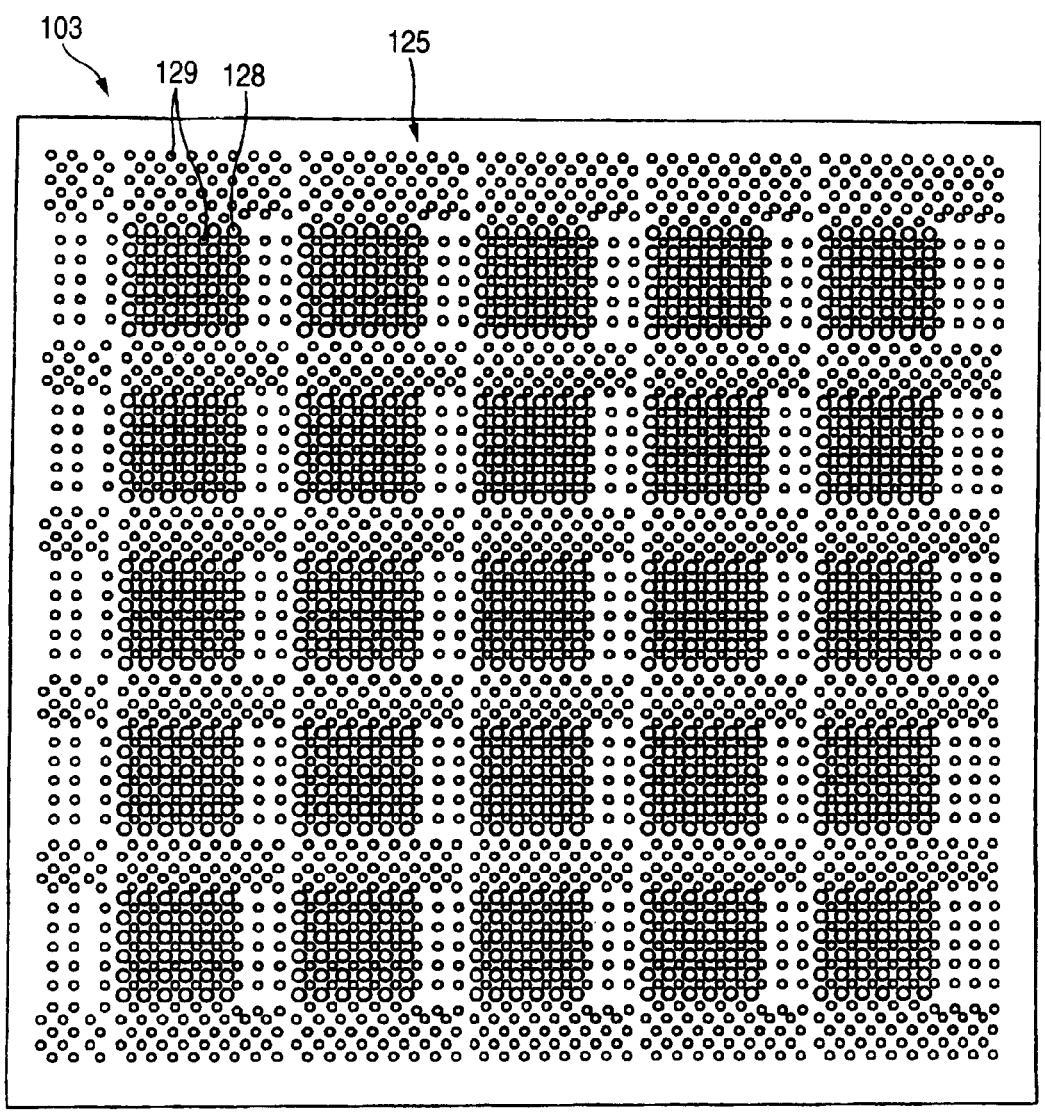
FIG. 5 is a plan view of a conductive ball mounting mask shown in FIG. 3.
Figure 6:
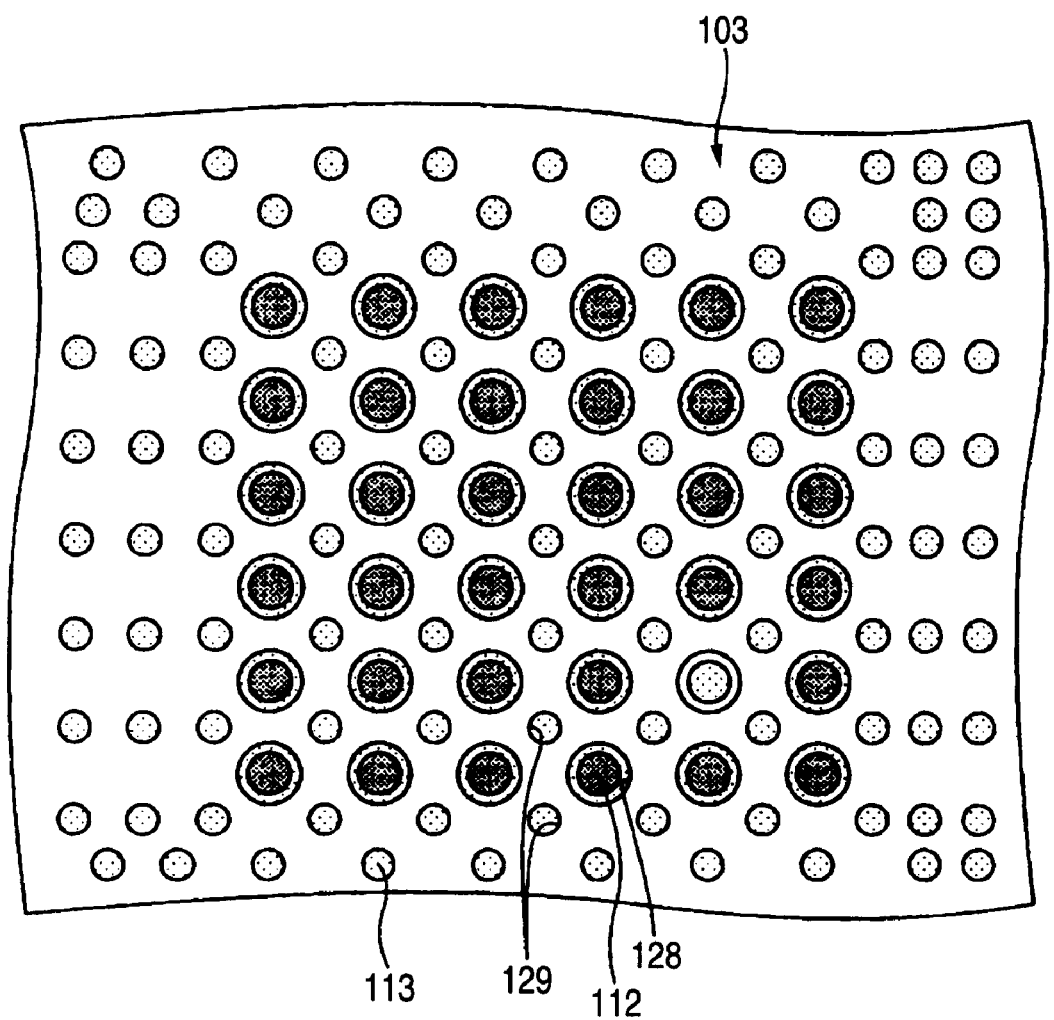
FIG. 6 is a plan view of the conductive ball mounting mask provided on the substrate.
Figure 7:
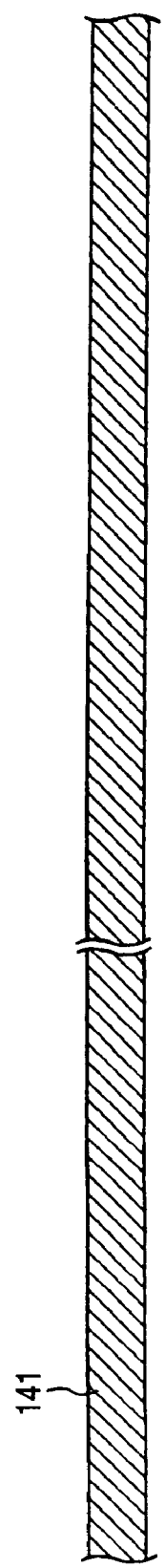
FIG. 7 is a view (#1) showing steps of manufacturing a conductive ball mounting mask when the conductive ball mounting mask is manufactured using a silicon substrate.

FIG. 5 is a plan view of the conductive ball mounting mask shown in FIG. 3, and FIG. 6 is a plan view of the conductive ball mounting mask disposed on the substrate.

By reference to FIG. 5 and FIG. 6, the plate body 125 has a plurality of ball mounting through holes 128 and a plurality of through portions 129. The plurality of ball mounting through holes 128 are formed to pass through the plate body 125. The plurality of ball mounting through holes 128 are disposed to correspond to any one of the plurality of pads 112 provided on the substrate. The plurality of ball mounting through holes 128 are used to mount one conductive ball 105 on each of the plurality of pads 112. A diameter of the ball mounting through hole 128 can be set to 1.1 to 1.7 times as large as a diameter of the conductive ball 105, for example. As the conductive ball 105, for example, either a solid sphere made of conductive material (e.g., Pb, Sn, Au, Ag, W, Ni, Mo, Al, or the like) or a solid sphere formed by coating a core made of resin with the conductive material can be employed. Also, a diameter of the conductive ball 105 can be set to 50 μm to 100 μm, for example.

The through portion 129 is formed in plural to pass through the conductive ball mounting mask 103. The through portions 129 serve as air vent portions that perform the ventilation of an air between an upper space and a lower space of the conductive ball mounting mask 103. The through portions 129 are shaped to block the passing of the conductive ball 105. A plane shape of the through portion 129 can be set to a circle, for example (see FIG. 5 and FIG. 6). Also, when a shape of the through portion 129 is set to a circle when viewed from a top, a diameter of the through portion 129 can be set to 0.05 to 0.9 times as large as a diameter of the conductive ball 105, for example.

The through portions 129 constructed as above are formed in the portions of the plate body 125 opposing to the pad forming areas C of the substrate 101, and the portions of the plate body 125 opposing to the areas of the substrate 101 except the pad forming areas C (in other words, the portions of the plate body 125 positioned near the ball mounting through holes 128).

In this manner, the through portions 129 for performing the ventilation of an air between the upper space and the lower space of the conductive ball mounting mask 103 are provided in the portions of the plate body 125 opposing to the pad forming areas C of the substrate 101. Therefore, for example, each of the conductive balls 105 is mounted on each of the plurality of pads 112 by collecting the plurality of conductive balls 105 on the conductive ball mounting mask 103 by a sucking force and also by moving the plurality of conductive balls 105 in the direction parallel with the upper surface 103A of the conductive ball mounting mask 103. Accordingly, the portion of the conductive ball mounting mask 103 being disposed over the pads 112 on which each of the conductive balls 105 is mounted is never lifted up from a certain position. As a result, one conductive ball 105 can be mounted surely on each of the plurality of pads 112 coated with the adhesive flux 115.

Also, the through portions 129 for performing the ventilation of an air between the upper space and the lower space of the conductive ball mounting mask 103 are provided in the portions of the plate body 125 opposing to the areas of the substrate 101 except the pad forming areas C. As a result, even though a sucking force of the sucking unit 132 is strong when the conductive ball 105 is mounted on each of the plurality of pads 112 by a sucking force of the sucking unit 132, it can be prevented that the portion of the conductive ball mounting mask 103 opposing to the area of the substrate 101 except the pad forming area C is lifted up from a certain position.

In this case, when a sucking force of the sucking unit 132 is weak, the through portions 129 may be provided only in the portion of the plate body 125 opposing to the pad forming area C of the substrate 101.

The plate body 125 constructed as above is stretched by a certain tension in the direction parallel with an upper surface 102A of the stage 102 such that the plate body 125 is not bended. A thickness of the plate body 125 can be set to 50 μm, for example.

Here, in FIG. 5 and FIG. 6, the case where the shape of the through portion 129 when viewed from the top is a circle is illustrated as an example. But the shape of the through portion 129 is not limited to a circle, and any shape may be employed if such shape can block the passing of the conductive ball 105. Concretely, as a shape of the through portion 129 when viewed from a top, for example, ellipse, triangle, quadrangle, polygon, or cross may be employed.

The supporting portions 126 are provided on the lower surface side of the plate body 125. The supporting portions 126 are formed integrally with the plate body 125. The supporting portions 126 are supporting members that support the plate body 125 while contacting the solder resist 113 provided on the substrate 101. A height of the supporting portions 126 can be set to 50 μm, for example.

In this manner, because there are provided the supporting portions 126 for supporting the plate body 125 in which the plurality of ball mounting through holes 128 and the plurality of through portions 129 are provided, the plate body 125 is hard to bend. Therefore, a relative displacement of the ball mounting through holes 128 from the plurality of pads 112 can be reduced. As a result, each of the conductive balls 105 can be mounted in certain positions on each of the plurality of pads 112 (e.g., center positions of the plurality of pads 112) with good precision.

As the material of the conductive ball mounting mask 103, for example, metal (metallic foil), or a silicon can be used, but it is advantageous that a silicon should be used. A deformation of the silicon plate generated by an external force, when shaped into a thin plate, is smaller than that of the metallic foil. For this reason, for example, when the conductive ball mounting mask 103 is stretched in the horizontal direction by a certain tension to restrict its position, a relative displacement of the ball mounting through holes 128 with respect to the plurality of pads 112 can be reduced. As a result, the conductive ball 105 can be mounted in certain positions on each of the plurality of pads 112 (e.g., center positions of the pads 112) with good precision.

Also, for example, insulating film (e.g., oxide film, nitride film, or the like), metal film (e.g., Ni film, Au film, Cu film, Ti film, Cr film, or the like) may be provided on the surface of the conductive ball mounting mask 103 using the silicon as the base material. Because the metal film is provided on the surface of the conductive ball mounting mask 103 using the silicon as the base material, it can be prevented that the conductive ball mounting mask 103 is charged.

FIG. 7 to FIG. 12 are views showing steps of manufacturing the conductive ball mounting mask when the conductive ball mounting mask is manufactured using the silicon substrate. In FIG. 7 to FIG. 12, the same reference symbols are affixed to the same constituent portions as those of the conductive ball mounting mask 103 shown in FIG. 3.

Here, a method of manufacturing the conductive ball mounting mask 103 when the silicon substrate is used as a base material will be described with reference to FIG. 7 to FIG. 12 hereunder. At first, in steps shown in FIG. 7, a silicon substrate 141 shaped into a thin plate is prepared (silicon substrate preparing step). Concretely, a silicon wafer (e.g., a thickness is 725 µm) is polished until its thickness is reduced to 100 µm, and thus the silicon substrate 141 shaped into the thin plate is formed.

Figure 8:
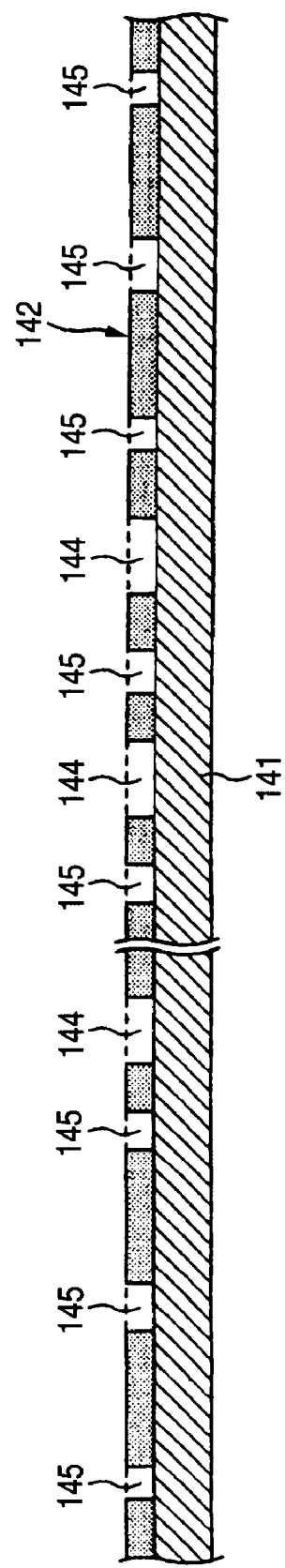
FIG. 8 is a view (#2) showing steps of manufacturing the conductive ball mounting mask when the conductive ball mounting mask is manufactured using the silicon substrate.

Then, in steps shown in FIG. 8, a resist film 142 having first openings 144 and second openings 145 is formed on the silicon substrate 141 (resist film forming step). At this time, the first openings 144 are formed to expose the portions of an upper surface of the silicon substrate 141 corresponding to areas in which the ball mounting through holes 128 are formed, and the second openings 145 are formed to expose the portions of an upper surface of the silicon substrate 141 corresponding to areas in which the through portions 129 are formed. A diameter of the first opening 144 can be set to 1.1 to 1.7 times as large as a diameter of the conductive ball 105, for example. Also, a diameter of the second opening 145 can be set to 0.05 to 0.9 times as large as a diameter of the conductive ball 105, for example.

Figure 9:
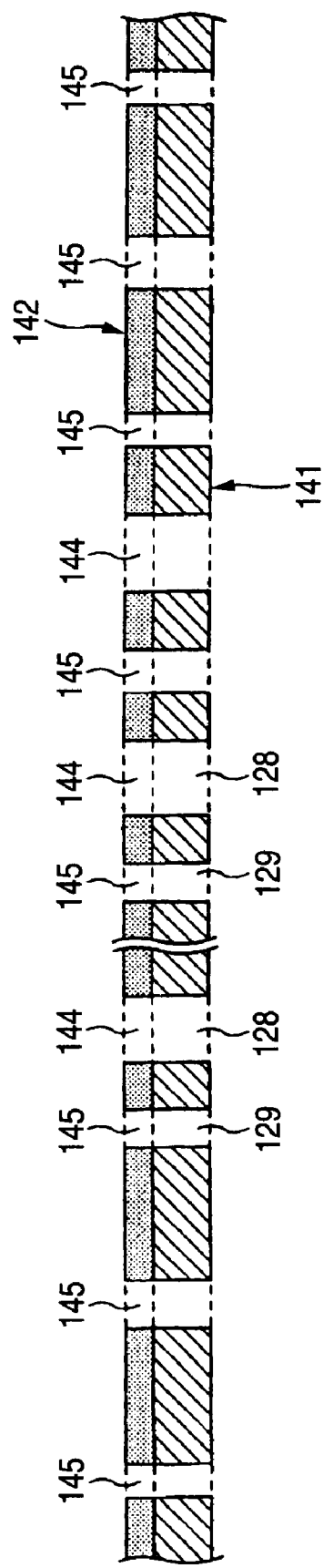
FIG. 9 is a view (#3) showing steps of manufacturing the conductive ball mounting mask when the conductive ball mounting mask is manufactured using the silicon substrate.

Then, in steps shown in FIG. 9, the plurality of ball mounting through holes 128 and the plurality of through portions 129 are formed simultaneously by etching the portions of the silicon substrate 141 by applying the anisotropic etching (e.g., dry etching using a gas such as $SF_6$) using the resist film 142 as a mask (ball mounting through hole and through portion forming steps). Accordingly, the plate body 125 having the plurality of ball mounting through holes 128 and the plurality of through portions 129 is manufactured. Also, because the plurality of ball mounting through holes 128 and the plurality of through portions 129 are formed at the same time, the steps of manufacturing the conductive ball mounting mask 103 can be simplified in contrast to the case where the plurality of ball mounting through holes 128 and the plurality of through portions 129 are formed separately. Further, accuracy of position of the plurality of ball mounting through holes 128 and the plurality of through portions 129 can be improved.

Figure 10:
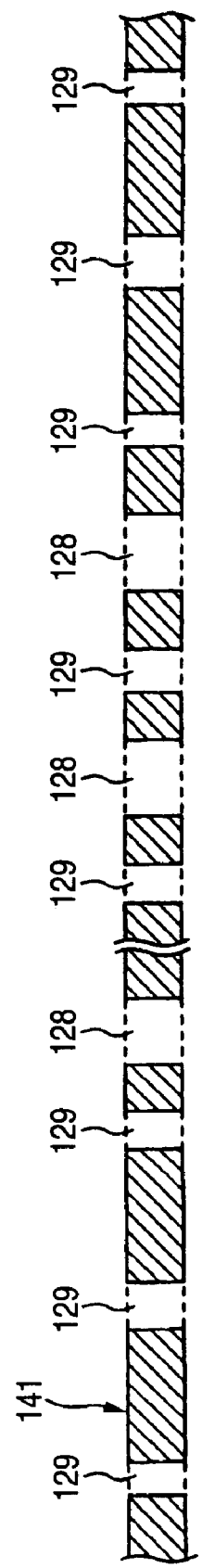
FIG. 10 is a view (#4) showing steps of manufacturing the conductive ball mounting mask when the conductive ball mounting mask is manufactured using the silicon substrate.

Then, in steps shown in FIG. 10, the resist film 142 shown in FIG. 9 is removed (resist film removing step). Then, in steps shown in FIG. 11, a resist film 161 is formed on portions of the lower surface of the silicon substrate 141 corresponding to areas in which the supporting portions 126 are formed, and then the supporting portions 126 are formed by etching the silicon substrate 141 by applying the anisotropic etching using the resist film 161 as a mask.

Figure 11:
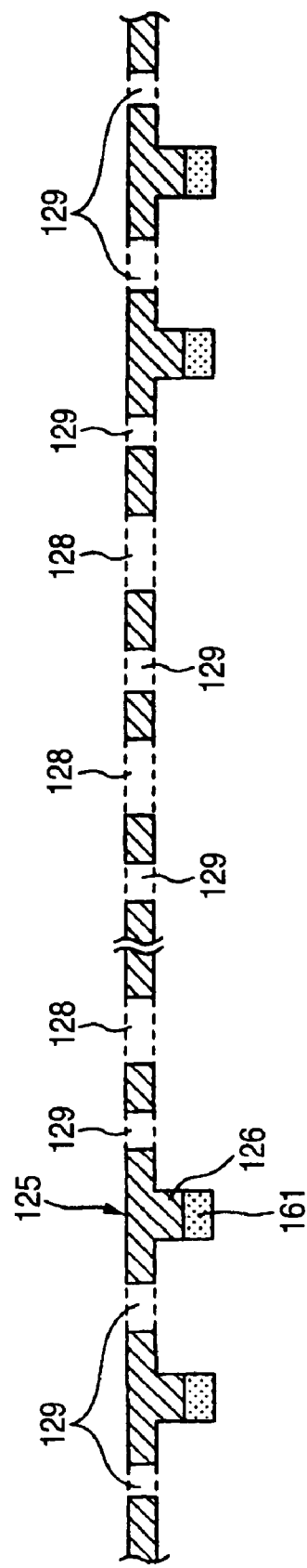
FIG. 11 is a view (#5) showing steps of manufacturing the conductive ball mounting mask when the conductive ball mounting mask is manufactured using the silicon substrate.
Figure 12:
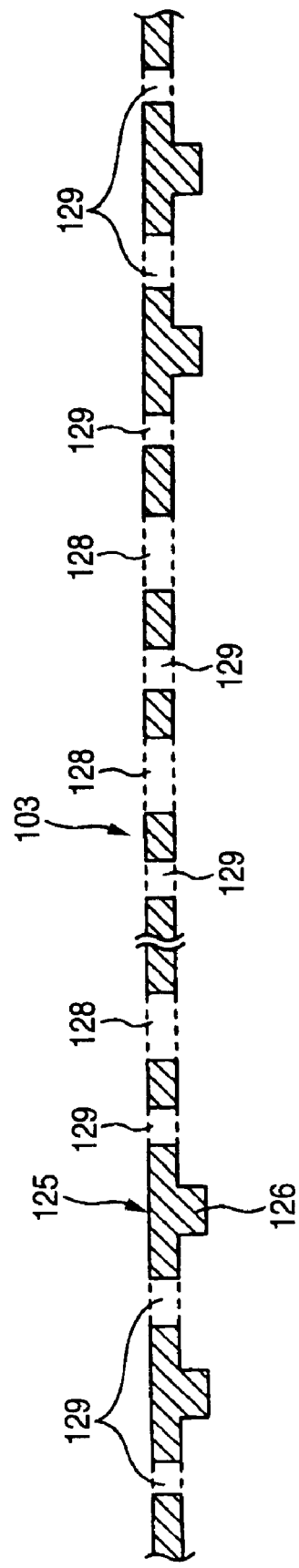
FIG. 12 is a view (#6) showing steps of manufacturing the conductive ball mounting mask when the conductive ball mounting mask is manufactured using the silicon substrate.

Then, in steps shown in FIG. 12, the resist film 161 shown in FIG. 11 is removed. Accordingly, the conductive ball mounting mask 103 using the silicon substrate 141 as the base material is manufactured.

In this way, the resist film 142 having the first openings 144, which expose the portions of the silicon substrate 141 corresponding to the areas in which the plurality of ball mounting through hole 128 are formed, and the second openings 145, which expose the portions of the silicon substrate 141 corresponding to the areas in which the through portions 129 are formed, is formed on the silicon substrate 141 shaped into a thin plate. Then, the plurality of ball mounting through holes 128 and the plurality of through portions 129 are formed simultaneously by the anisotropic etching using the resist film 142 as a mask. Then, the resist film 142 is removed. Then, the resist film 161 is formed on the lower surface of the portions of the silicon substrate 141 corresponding to the forming areas of the supporting portions 126. Then, the supporting portions 126 are formed by etching the silicon substrate 161 by applying the anisotropic etching using the resist film 142 as a mask. As a result, the conductive ball mounting mask 103 using the silicon substrate 141 as the base material is manufactured.

According to the conductive ball mounting apparatus of the present embodiment, the through portions 129 that perform the ventilation of an air between an upper space and a lower space of the conductive ball mounting mask 103 by a sucking force generated by the sucking unit 132 but prevent the passing of the conductive ball are provided in the conductive ball mounting mask 103 that has the plurality of ball mounting through holes 128 through which each of the conductive balls 105 is mounted on each of the plurality of pads 112 coated with the adhesive flux 115. Therefore, the portion of the conductive ball mounting mask 103 disposed over the pads 112 on which each of the conductive balls 105 is mounted is never lifted up from a certain position. As a result, one conductive ball 105 can be mounted without fail on each of the plurality of pads 112.

Figure 13:
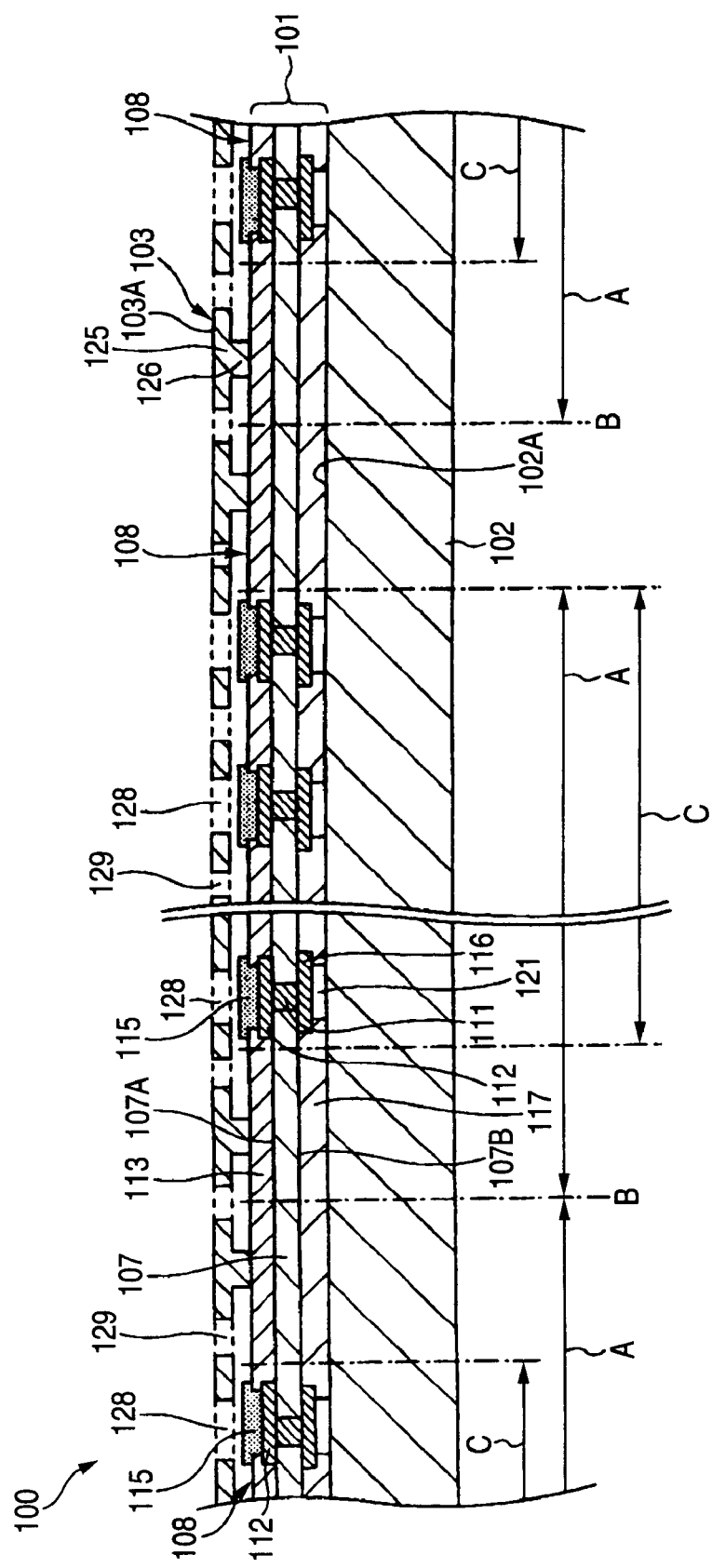
FIG. 13 is a view (#1) to describe an example of a conductive ball mounting method according to the embodiment of the present invention.
Figure 14:
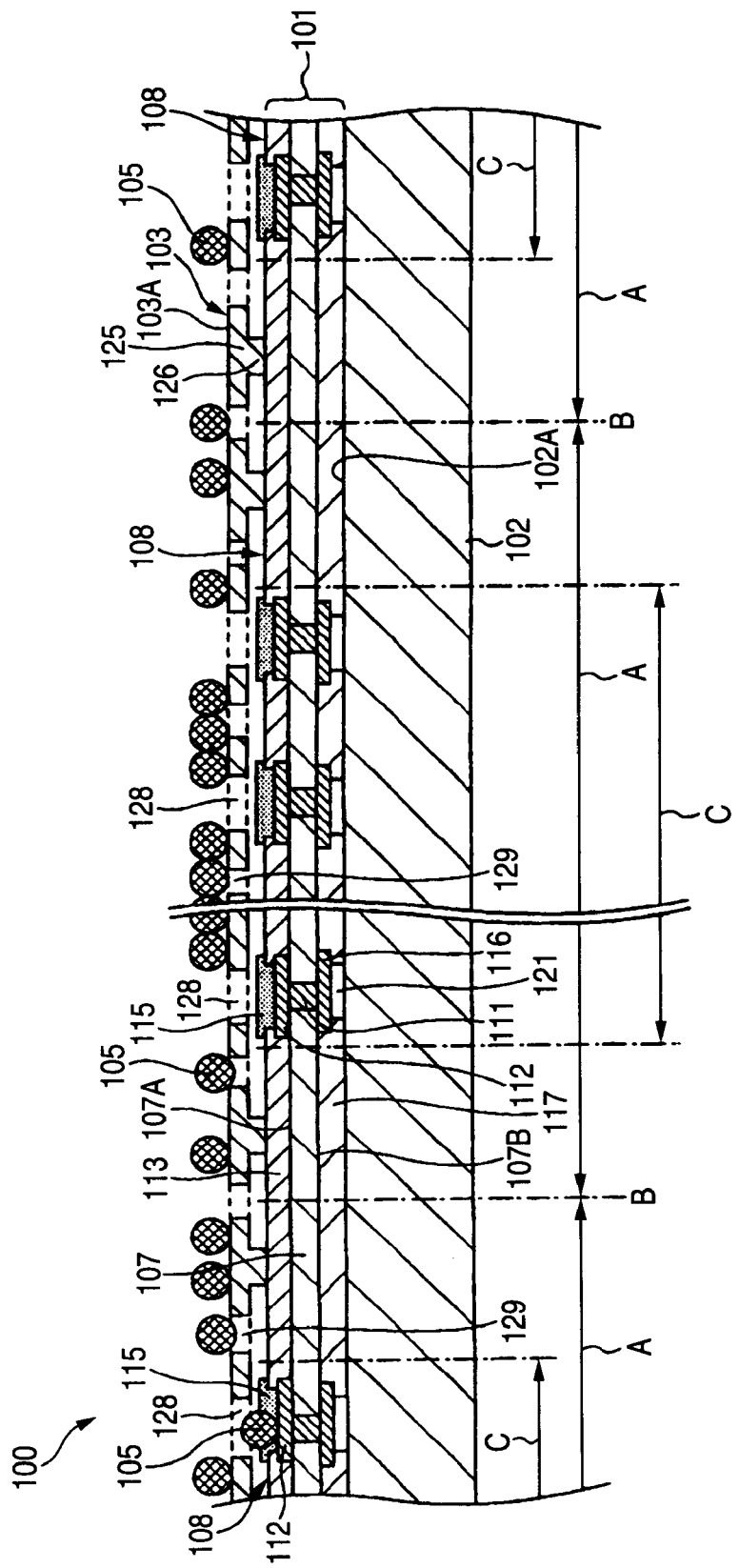
FIG. 14 is a view (#2) to describe an example of the conductive ball mounting method according to the embodiment of the present invention.
Figure 15:
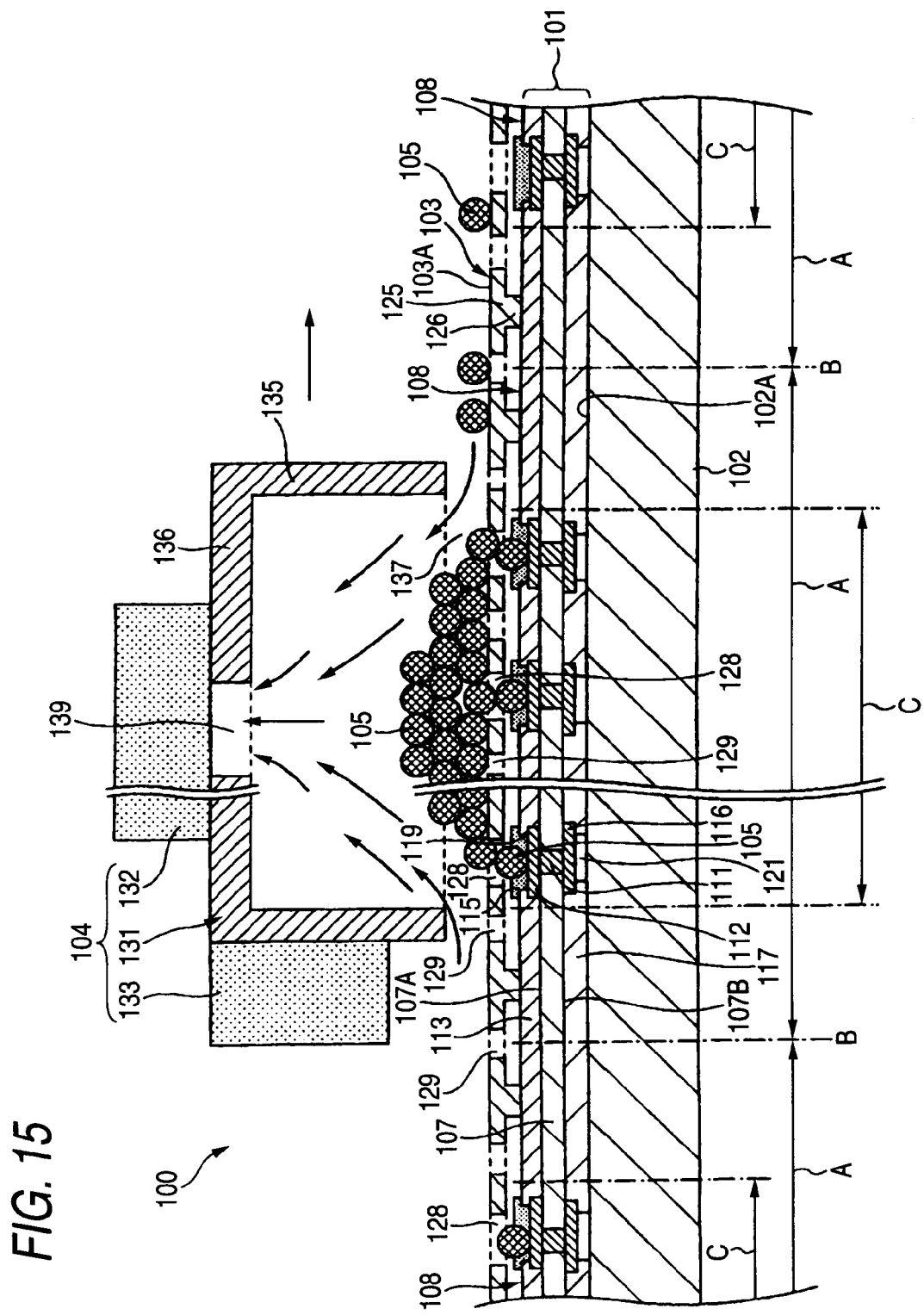
FIG. 15 is a view (#3) to describe an example of the conductive ball mounting method according to the embodiment of the present invention.

FIGS. 13 to 15 are views to describe an example of the conductive ball mounting method according to the embodiment of the present invention. In FIG. 13 to FIG. 15, the same reference symbols are affixed to the same constituent portions as those of the structure shown in FIG. 3.

The method of mounting the conductive ball 105 using the conductive ball mounting apparatus 100 will be described with reference to FIG. 13 to FIG. 15 hereunder. At first, in steps shown in FIG. 13, the conductive ball mounting mask 103 having the plurality of ball mounting through hole 128, which are used to mount one conductive ball 105 on each of the plurality of pads 112, and the through portions 129, which are formed to block the passing of the conductive ball 105, is disposed over the substrate 101 to oppose to this substrate (conductive ball mounting mask arranging step).

Then, in steps shown in FIG. 14, the plurality of conductive balls 105 are supplied onto the conductive ball mounting mask 103 disposed in a certain position on the substrate 101 that is held on the stage 102 (conductive ball supplying step). At this time, the conductive balls 105 are mounted on a part of the plurality of pads 112.

Then, in steps shown in FIG. 15, the plurality of conductive balls 105 are moved in the direction that is parallel with the upper surface 103A of the conductive ball mounting mask 103, while collecting the plurality of conductive balls 105 being fed onto the conductive ball mounting mask 103 in a certain area of the conductive ball mounting mask 103 (concretely, the portion of the conductive ball mounting mask 103 opposing to the inlet port 137) by sucking an air from the upper surface 103 side of the conductive ball mounting mask 103 (conductive ball moving step). Accordingly, in the conductive ball supplying step, one conductive ball 105 is mounted on all pads 112, on which the conductive ball 105 was not mounted.

According to the method of mounting the conductive ball of the present embodiment, while collecting the plurality of conductive ball 105 being fed onto the conductive ball mounting mask 103 on the portion of the conductive ball mounting mask 103 opposing to the inlet port 137, these conductive ball 105 are moved in the direction that is parallel with the upper surface 103A of the conductive ball mounting mask 103 by sucking the upper surface 103A side of the conductive ball mounting mask 103 in which the plurality of ball mounting through holes 128 and the through portions 129 being formed to block the passing of the conductive ball 105 are provided. Therefore, the portion of the conductive ball mounting mask 103 being disposed over the pads 112 on which each of the conductive balls 105 is mounted is never lifted up from a certain position. As a result, one conductive ball 105 can be mounted on each of the plurality of pads 112 without fail.

Figure 16:
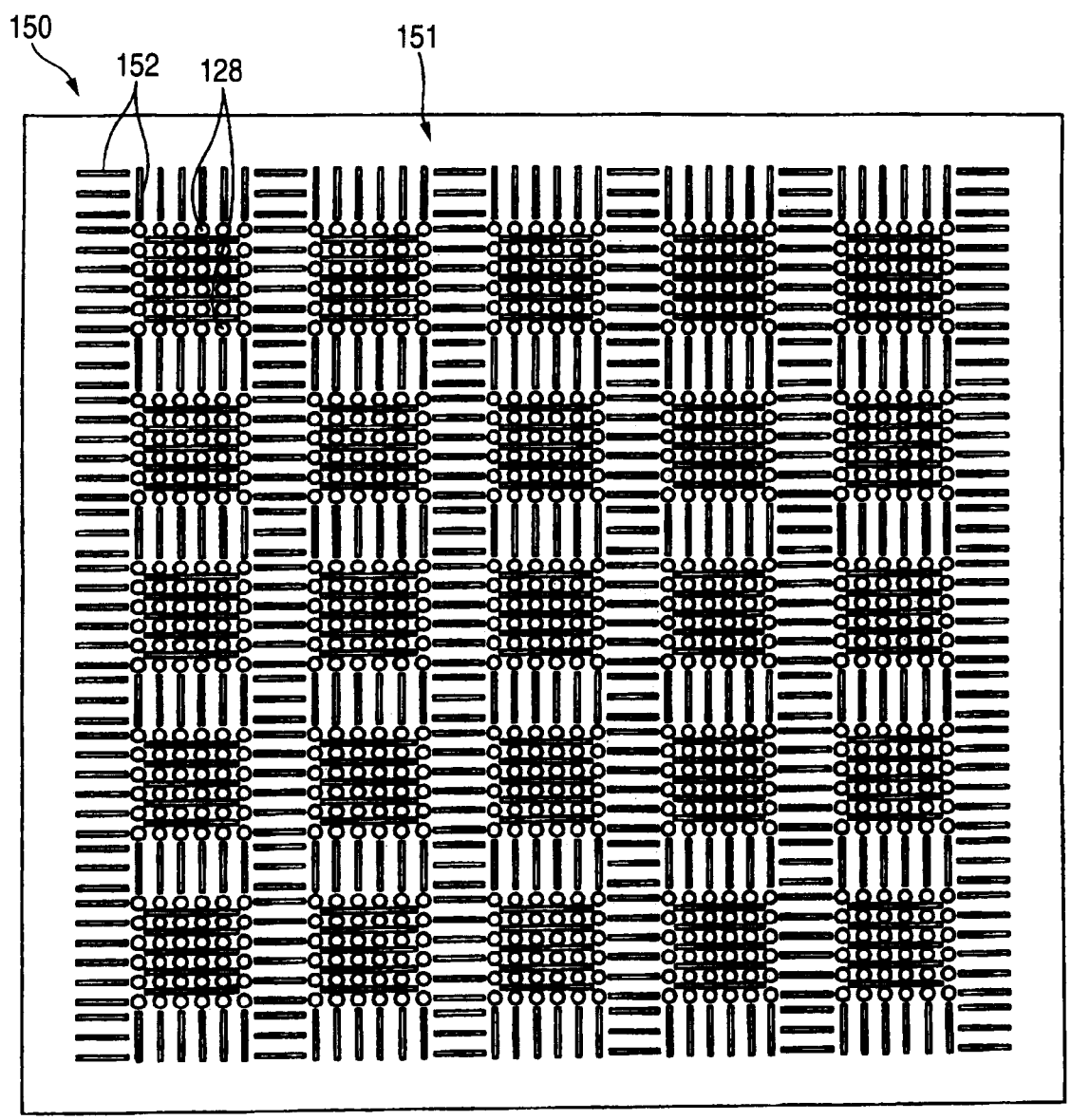
FIG. 16 is a plan view showing a variation of the conductive ball mounting mask.

FIG. 16 is a plan view showing a variation of the conductive ball mounting mask. The illustration of the supporting portions 126 is omitted herein.

By reference to FIG. 16, the conductive ball mounting mask 150 is constructed similarly to the conductive ball mounting mask 103 except that a plate body 151 is provided instead of the plate body 125 that is provided to the conductive ball mounting mask 103 described in FIG. 3 and FIG. 5.

The plate body 151 has a plurality of ball mounting through holes 12 and through portions 152. The through portion 152 is a through slot (slit) formed to pass through the plate body 151, and the plurality of through portions 152 are formed in the plate body 151. The through portions 152 serve as the air vent ports that perform the ventilation of an air between an upper space and a lower space of the conductive ball mounting mask 150. The through portions 152 have a size (shape) that can block the passing of the conductive balls 105. A width of the through portion 152 when viewed from the top can be set to 0.05 to 0.9 times as large as a diameter of the conductive ball 105, for example.

The through portions 129 are formed in the portions of the plate body 151 opposing to the pad forming areas C of the substrate 101 (in other words, the portions of the plate body 151 positioned near the ball mounting through holes 128), and the portions of the plate body 151 opposing to the areas of the substrate 101 except the pad forming areas C. A thickness of the plate body 151 can be set to 50 μm, for example.

In the present embodiment, explanation is made by taking as an example the case where each of the conductive balls 105 is mounted on each of a plurality of pads 112 using the conductive ball mounting mask 103 shown in FIG. 5. But the conductive ball 105 may be mounted on each of the plurality of pads 112 by providing the conductive ball mounting mask 150 shown in FIG. 16 to the conductive ball mounting apparatus 100 instead of the conductive ball mounting mask 103. In this case, the similar advantages to the case where the conductive ball mounting mask 103 is used can be achieved.

Here, when a sucking force of the sucking unit 132 is weak, the through portion 152 may be provided only in the portions of the plate body 125 opposing to the pad forming areas C of the substrate 101.

With the above, preferred embodiments of the present invention are described in detail. But the present invention is not restricted to such particular embodiment, and various variations and modifications can be applied within a scope of a gist of the present invention set forth in claims.

For example, the conductive ball mounting mask 103 or 150 described in the present embodiment may be applicable to the conductive ball mounting apparatus including a ball recovering means that recovers the unnecessary conductive balls 105 not mounted on the pads 112 by the suction.

The present invention is applicable to the conductive ball mounting apparatus for mounting one conductive ball on each of the plurality of pads coated with the adhesive flux on the substrate such as the wiring substrate or the semiconductor wafer, the conductive ball mounting method, the mask used for mounting conductive balls, and the mask manufacturing method.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A conductive ball mounting method of mounting one conductive ball on each of a plurality of pads coated with an adhesive flux on a substrate, the conductive ball mounting method comprising:
    (a) disposing a conductive ball mounting mask over the substrate such that the conductive ball mounting mask is opposed to the substrate, wherein the conductive ball mounting mask includes a plurality of ball mounting through holes for mounting each of conductive balls on each of the plurality of pads and a plurality of air vent portions spaced from and between the plurality of ball mounting through holes to allow air to ventilate through the conductive ball mounting mask, the vent air portions being sized so as to prevent conductive balls from passing therethrough;
    (b) supplying the plurality of conductive balls on the conductive ball mounting mask; and
    (c) moving or removing the plurality of conductive balls on the conductive ball mounting mask by sucking an air on an upper surface side of the conductive ball.

2. The conductive ball mounting method according to claim 1, wherein the air vent portions are disposed near the plurality of ball mounting through holes.

* * * * *